(12) United States Patent
Jacobson et al.

(10) Patent No.: US 6,704,496 B2
(45) Date of Patent: Mar. 9, 2004

(54) HIGH TEMPERATURE DROP-OFF OF A SUBSTRATE

(75) Inventors: Paul Jacobson, Phoenix, AZ (US); Ivo Raaijmakers, Bilthoven (NL); Ravinder Aggarwal, Gilbert, AZ (US); Robert C. Haro, Gilbert, AZ (US)

(73) Assignee: ASM America, Inc., Phoenix, AZ (US)

( * ) Notice: Subject to any disclaimer, the term of this patent is extended or adjusted under 35 U.S.C. 154(b) by 67 days.

(21) Appl. No.: 10/291,897

(22) Filed: Nov. 8, 2002

(65) Prior Publication Data

US 2003/0070758 A1 Apr. 17, 2003

Related U.S. Application Data

(62) Division of application No. 09/840,532, filed on Apr. 23, 2001, now Pat. No. 6,521,503.

(51) Int. Cl.[7] .................................................. F26B 3/30
(52) U.S. Cl. ...................... 392/418; 392/416; 219/390; 219/405; 219/411; 118/724; 118/725; 118/50.11
(58) Field of Search ................................. 219/390, 405, 219/411; 392/416, 418; 118/724, 725, 50.1

(56) References Cited

U.S. PATENT DOCUMENTS

| 4,116,733 | A | 9/1978 | Olsen et al. |
|---|---|---|---|
| 4,331,485 | A | 5/1982 | Gat |
| 5,011,794 | A | 4/1991 | Grim et al. |
| 5,080,549 | A | 1/1992 | Goodwin et al. |
| 5,203,547 | A | 4/1993 | Marumo |
| 5,834,322 | A | 11/1998 | Fusegawa et al. |
| 5,997,588 | A | 12/1999 | Goodwin et al. |
| 6,068,441 | A | 5/2000 | Raaijmakers et al. |
| 6,072,157 | A | 6/2000 | Klebanoff et al. |
| 6,111,225 | A | 8/2000 | Ohkase et al. |
| 6,113,984 | A | * 9/2000 | MacLeish et al. ...... 427/255.32 |
| 6,136,725 | A | 10/2000 | Loan et al. |
| 6,151,446 | A | 11/2000 | Hunter et al. |
| 6,183,183 | B1 | 2/2001 | Goodwin et al. |
| 6,184,972 | B1 | 2/2001 | Mizutani et al. |
| 6,191,399 | B1 | 2/2001 | Van Bilsen |
| 6,209,220 | B1 | 4/2001 | Raaijmakers |
| 6,242,718 | B1 | * 6/2001 | Ferro et al. ................. 219/405 |
| 6,290,491 | B1 | 9/2001 | Shahvandi et al. |
| 6,306,183 | B1 | 10/2001 | Fujita et al. |
| 6,344,084 | B1 | 2/2002 | Koinuma et al. |
| 6,413,321 | B1 | * 7/2002 | Kim et al. .................. 118/725 |
| 6,483,081 | B1 | * 11/2002 | Batchelder .................. 219/390 |

* cited by examiner

Primary Examiner—Henry Bennett
Assistant Examiner—Shawntina Fuqua
(74) Attorney, Agent, or Firm—Knobbe, Martens, Olson & Bear, LLP

(57) ABSTRACT

A substrate to be processed in a high temperature processing chamber is preheated to avoid the problems associated with thermal shock when the substrate is dropped onto a heated susceptor. Preheating is effected by holding the substrate over a susceptor maintained at or near the processing temperature until the temperature of the substrate approaches the processing temperature. Thus, wafer warping and breakage are greatly reduced, and wafer throughput is improved because of time saved in maintaining the susceptor at constant temperature without cool down and reheat periods.

12 Claims, 3 Drawing Sheets

HIGH TEMPERATURE DROP-OFF OF A SUBSTRATE

RELATED APPLICATIONS

This application is a divisional of application Ser. No. 09/840,532, filed Apr. 23, 2001, now U.S. Pat. No. 6,521,503.

BACKGROUND OF THE INVENTION

1. Field of the Invention

The present invention relates to substrate transport into processing chambers such as semiconductor chemical vapor deposition reactors, and, more particularly, to a method for increasing substrate throughput and reducing loss of product by reducing thermal shock to the substrate, which can cause breakage and poor quality of the deposited film.

2. Description of the Related Art

In the manufacture of integrated circuits, semiconductor substrates, or wafers, are often processed by chemical vapor deposition. Components of chemical vapor deposition systems include a reaction chamber that is configured to facilitate the controlled flow of a reactant gas and a wafer holder, which is commonly referred to in the art as a "susceptor," for supporting and heating the wafer during processing. To facilitate automated processing, a robotic arm with a wafer handler, or end effector, on the end is employed to place a wafer onto the susceptor for processing and to remove it from the reactor after processing.

In high temperature film deposition or annealing processes, a wafer must be heated to a predetermined temperature after it is introduced into a processing chamber. For example, in epitaxy processes, the temperature is typically around 1090° C. to 1190° C. This wafer heating can be effected by conduction through direct contact with a heated susceptor, or by radiation through the use of heating lamps.

In current chemical vapor deposition epitaxial reactors, the wafer is typically at room temperature when it is loaded into the process chamber, which is still at a much higher temperature, perhaps as high as 900° C. When the substrate is dropped onto the susceptor, both substrate and susceptor experience thermal shock. As its mass is so much less than the susceptor's, the substrate's shock is more significant. The thermal effect experienced by the substrate usually varies throughout the extent of the substrate, that is to say that there are large thermal gradients, which may be difficult to mitigate. This can lead to substrate warping and breakage and also to poor uniformity and quality of deposited films.

The susceptor also experiences thermal shock, which is repeated with wafer after wafer, and can ultimately reduce the working lifetime of the susceptor. Usually the susceptor is prepared to receive a wafer by cooling to a temperature much less than the process temperature in order to reduce the thermal shock. Then, once the wafer is in place, the susceptor must be reheated to the process temperature before processing can proceed. This repeated temperature cycling, solely for the purpose of wafer transfer, slows wafer throughput, so most manufacturers compromise by making only small temperature reductions during wafer transfer. This results in less thermal shock but does not completely solve the problem.

There has been some experimentation in the past by customers of the assignee of the present invention in which the heaters for the susceptors were de-energized while a wafer was held above the susceptor for a short interval, before being deposited on the susceptor. While this preheating of the wafer reduced shock to the wafer, there was still some warpage of the wafer and the susceptor temperature was dropping during the delay. The temperature when the handler was introduced to the process chamber was probably in the range of about 850° C. to about 900° C., the temperature of the susceptor and the wafer was probably below 850° C. when the wafer was deposited on the susceptor. Also, heat damage to the handler construction limited the temperature that could be maintained.

There is a clear need for a method of wafer exchange in high temperature process chambers that reduces the thermal shock experienced by both the wafer and the susceptor without adversely affecting process throughput, and instead enhancing throughput.

SUMMARY OF THE INVENTION

If the wafer can be preheated to a temperature at or near the process temperature before being put on the susceptor, many benefits are accrued. Wafer throughput is increased because no additional time is needed to cool down and subsequently reheat the susceptor during wafer transfer. The temperature remains more uniform because the susceptor remains at or close to the process temperature instead of cycling through cooling and re-heating steps. There is reduced wafer breakage, resulting in less downtime. There is less wafer warping, resulting in better temperature consistency across the wafer and, therefore, better deposited film quality and uniformity. Consumable components, such as susceptors, undergo less thermal shock, thus prolonging their lifetimes and reducing the cost of operating the process equipment.

In general, an embodiment of the current invention comprises a substrate holder configured to support a single substrate for processing in a high temperature chamber. Processing methods that can use the apparatus and method recited herein include chemical vapor deposition, epitaxy, rapid thermal processing, etching, annealing, etc. A substrate handler can pick up an unprocessed substrate, put it on the substrate holder for processing and remove it after processing is complete. Heating is effected by a plurality of heating elements that are positioned to heat the substrate holder, and a control system maintains the substrate holder at a high temperature, such as more than 900° C., during wafer transfer. It is preferred that, while holding an unprocessed substrate, the substrate handler pause in a position close to and above the substrate holder for a period of time that allows the wafer to preheat. Preferably, the heating elements are radiant lamps that heat the wafer from above while the hot susceptor is heating the wafer from below, and thus minimize warpage of the wafer.

DETAILED DESCRIPTION OF THE PREFERRED EMBODIMENT

Figure 1:
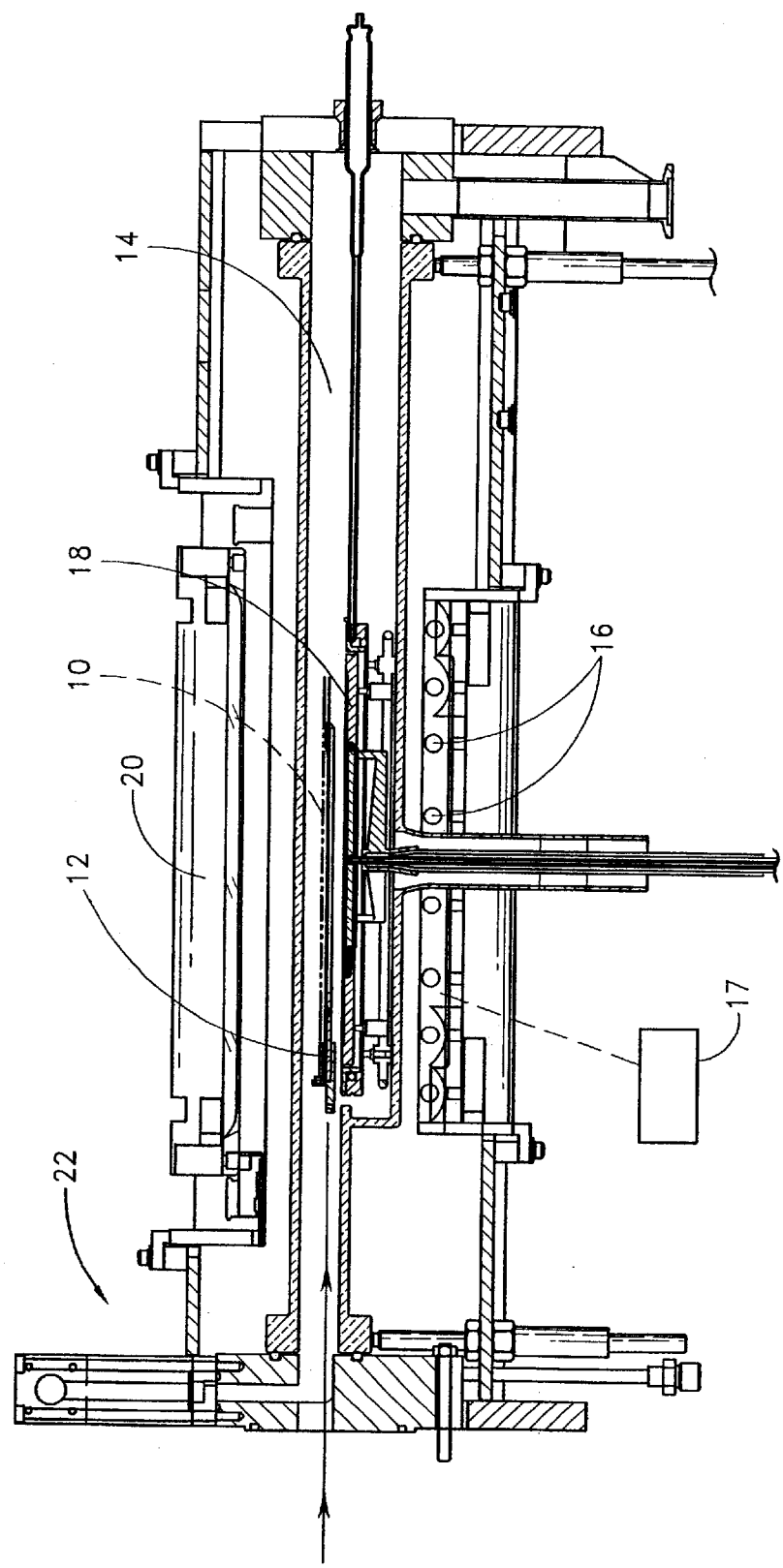
FIG. 1 shows a high temperature process chamber wherein a substrate is positioned over a heated susceptor during a preheat period of the method described herein.

A preferred embodiment of the current invention is described with reference to FIG. 1 for a substrate, particularly a silicon wafer 10, transported by an end effector 12 in a cold wall chemical vapor deposition chamber 14 formed by quartz chamber walls. Details about the chemical vapor deposition chamber of the preferred embodiment are treated in U.S. Pat. No. 6,191,399, issued Feb. 20, 2001, which is incorporated by reference herein. Heating elements 16 that heat the substrate support or susceptor 18 are shown below the chamber. Details about the susceptor can be found in U.S. Pat. No. 6,068,441, issued May 30, 2000, which is included by reference herein. Additional heating of the susceptor is effected by radiant heating lamps 20 above the process chamber. In another embodiment, the susceptor can also be heated by resistive heating elements within the substrate support. Gas tubes 22 attached through the wall of the process chamber 14 provide a path for flow of process gas and purging gas into the chamber 14. Although the apparatus described above is a chemical vapor deposition chamber, the method described herein applies to other high temperature process chambers as well.

In a preferred embodiment of the method described herein, the process chamber 14 and the susceptor 18 are maintained at, or very near to, the process temperature, preferably greater than 900° C., more preferably greater than 1000° C. In the illustrated epitaxial chamber, the process temperature can be as high as 1190° C.

The wafer 10 is introduced into the process chamber 14 on an end effector 12, which may be a paddle with a fork-like configuration that extends beneath a portion of the wafer and leaves a substantial lower wafer surface (>60%) exposed to the susceptor 18. In this case, the end effector preferably holds the wafer by its edges. In the illustrated embodiment, however, the wafer is introduced on a Bernoulli wand, which uses gas flow to create a low pressure above the wafer to hold the wafer from above without making direct contact with the wafer upper surface. A suitable Bernoulli wand is described in further detail in U.S. Pat. No. 5,997,588, issued Dec. 7, 1999. Another version described in U.S. Pat. No. 6,183,183, issued Feb. 6, 2001, has only quartz components that extend into the process chamber, and hence can withstand high process temperatures. Both documents are incorporated herein by reference. The Bernoulli wand can be made of material substantially transparent to radiant energy, so that it does not prevent radiant energy from the lamps above from reaching the wafer. Alternatively, the Bernoulli wand can be made of material that absorbs radiant energy, so that the wand heats also and re-radiates or conducts heat to the wafer 10.

The wafer 10 is held above the susceptor 18 by an end effector 12, for a length of time determined by a temperature controller 17, preferably until the wafer 10 reaches within about 200° C. of the temperature of the susceptor 18, and more preferably within about 100° C. of the susceptor temperature. As noted above, the susceptor 18 is preferably maintained above 900° C. and most preferably at the process temperature by the temperature controller 17. Preferably, the preheat of the wafer 10 is through the direct use of radiant heating lamps 20 to the upper surface of the wafer and to the lower surface from the susceptor.

During the wafer preheat, the purging gas flow rate through the gas tube 22 may be reduced below the normal flow rate used to purge the chamber of process gas. The purging gas flow rate is preferably reduced to 5–10 standard liters per minute. This is done to reduce cooling of the wafer from rapid gas flow during the preheat period. Of course, gas through the Bernoulli wand is maintained at whatever level is needed to hold the wafer. Thus, reduced flow rate is more significant for a paddle-type wafer handler.

After a preheat period, the wafer 10 is put on the susceptor 18 with minimal thermal shock, and the wafer 10 is ready for processing. The selected preheat period depends upon the starting temperature and the susceptor idling temperature. In the illustrated embodiment, where a "cold" wafer, at less than about 100° C., more typically less than 50° C., is introduced into the chamber while the susceptor idles at great than 900° C., the preheat period is at least 10 seconds, preferably greater than about 15 seconds.

Figure 2:
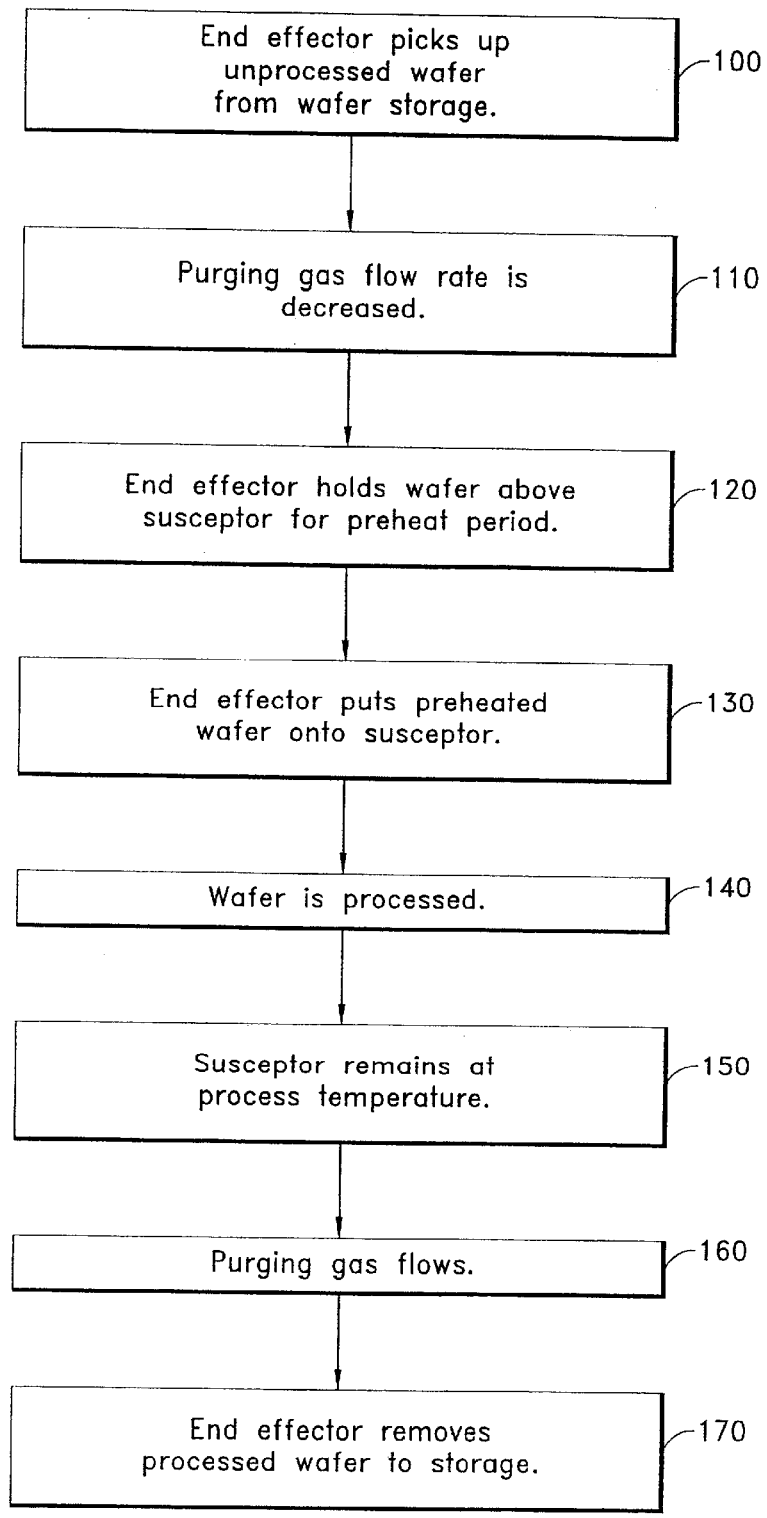
FIG. 2 is a flow chart explaining the steps involved in a preferred embodiment of the invention.

The flow chart of FIG. 2 summarizes the steps involved in effecting wafer preheat according to a preferred embodiment of the current invention. In the first process step 100, the end effector picks up the next unprocessed wafer from a wafer cassette or other storage area and moves it into the process chamber. In step 110, which is optional, the purging gas flow rate is preferably decreased to reduce any cooling effects on the wafer as it preheats. Pausing over the susceptor, which is maintained at or close to the process temperature, the end effector holds the wafer during the preheat period 120. When preheating is complete, the wafer in step 130 is put on the susceptor, and the processing step 140 is performed. When the wafer processing is complete, the susceptor still remains at or close to the process temperature as step 150, and purging gas begins to flow in step 160. The end effector removes the processed wafer to storage as step 170. The cycle begins again with step 100, loading of the next unprocessed wafer.

Figure 3:
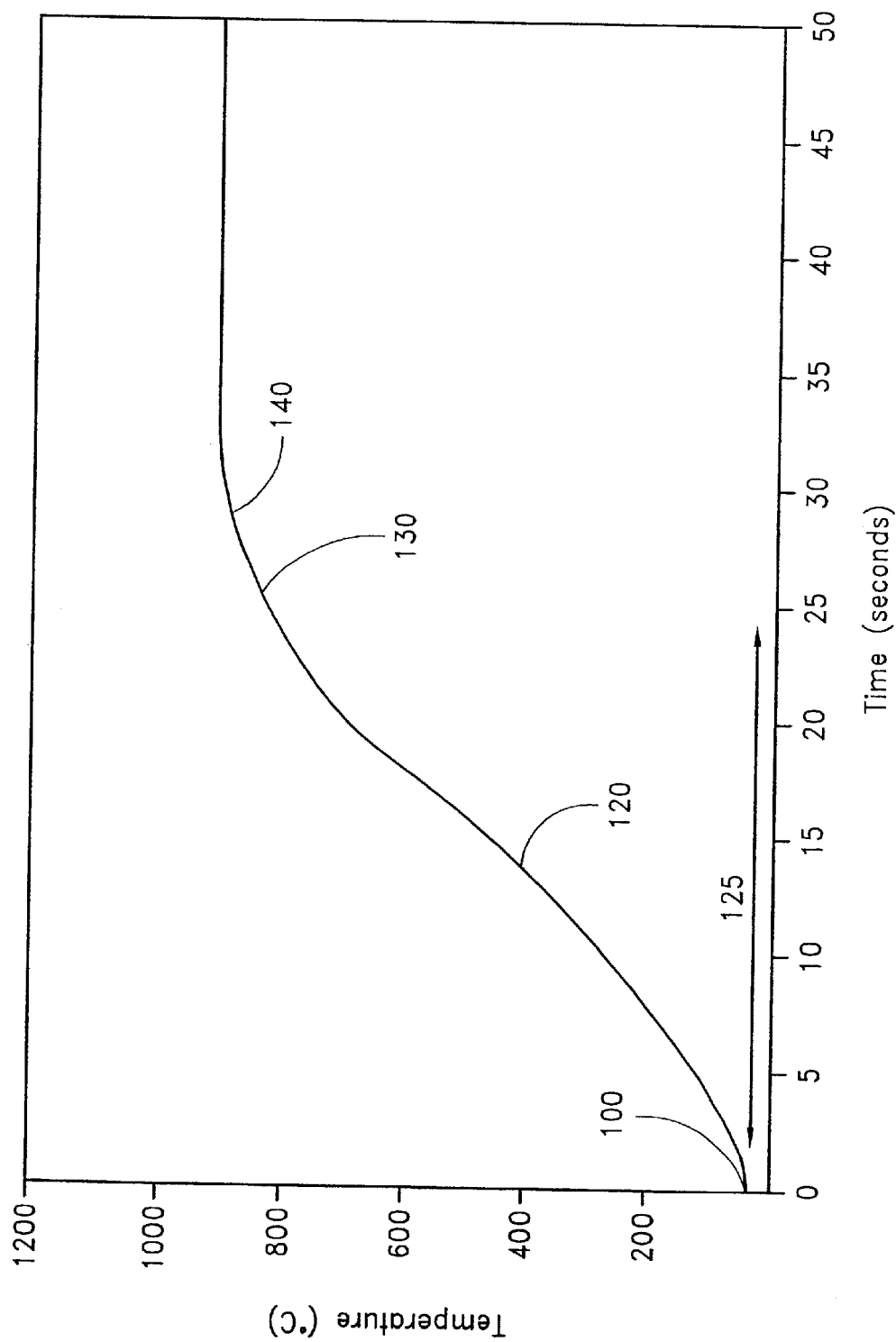
FIG. 3 is a graph of temperature as a function of time for a wafer during the steps of transport into the chamber, preheating, processing and removal from the chamber according to an embodiment of the current invention.

The temperature benefits of wafer preheating according to the preferred embodiment can be further understood with reference to the graph of FIG. 3. The wafer is typically at room temperature when it is picked up from the cassette by the end effector, as indicated as step 100 of the flow chart. The wafer is moved into a position over the susceptor, which is at the process temperature of about 900° C. or greater, and held for the preheat period 125 in accordance with step 120. By the end of the preheat period 125, the wafer has reached a temperature of about 700° C., or about 200° C. below the process temperature. The wafer is put on the susceptor in step 130, and reaches 900° C. within a few seconds. The wafer could be heated further before being placed on the susceptor, but the temperature difference of about 200° C. is small enough to ensure that thermal shock will be negligible. Temperature is shown as constant during processing on the graph of FIG. 3, but temperatures vary for particular processes and may include multiple steps at different temperatures. Preferably at least the first process step is at or above the susceptor idling temperature. The graph illustrates a preheat period 125 of about 25 seconds, but that too will vary with different reactions. After processing, the wafer is picked up for removal by the end effector.

Advantageously, the preheat approach reduces wafer warping and breakage, which results in better quality processing and less unscheduled down time to remove wafer fragments from the equipment. Wafer throughput is also increased because time is no longer spent on temperature cycling, i.e., cooling down and reheating, the susceptor during wafer transfers. The susceptor can be maintained at the same process temperature all the time.

We claim:

1. An apparatus for processing substrates comprising:
    a substrate support;
    a robot handler to place a substrate on the support and to remove the substrate from the support;
    one or more heating elements positioned to heat at least the substrate and the substrate support; and
    a control system configured to cause the handler to hold the substrate above the substrate support for a preheat period before placing the substrate on the support, while maintaining a support temperature of greater than about 900° C. during the time the substrate is being moved on or off the support.

2. The apparatus of claim 1 wherein the heating elements include radiant heat lamps.

3. The apparatus of claim 1 wherein the heating elements include a resistive heating element in the substrate support.

4. The apparatus of claim 1 wherein said heating elements include a plurality of radiant heating lamps which are positioned above the substrate support, and said handler is configured to move above the substrate support and below the lamps, said control system during said preheat period is configured to cause the lamps to heat the upper side of said substrate during said preheat period while said substrate support heats a lower side of the substrate.

5. The apparatus of claim 4 wherein said robot handler is a Bernoulli wand which is configured to hold the substrate from above by creating a low gas pressure above the wafer without contacting the upper surface of the wafer, and said wand is substantially transparent to radiant energy such that the substrate can be heated from above by said lamps.

6. The apparatus of claim 4 wherein said robot handler is a Bernoulli wand which is configured to hold the substrate from above by creating a low gas pressure above the wafer without contacting the upper surface of the wafer, and said wand absorbs radiant energy such that the wand and the substrate can be heated by said lamps.

7. The apparatus of claim 4 wherein said robot handler includes a paddle to support a substrate from below while maintaining a substantial portion of the lower surface of the substrate exposed to the substrate support during said preheat period.

8. The apparatus of claim 4 wherein said robot handler comprises an end effector that holds the substrate by substrate edges.

9. An apparatus for processing substrates comprising:

a substrate support;

a substrate handler to place a substrate on the support and to remove the substrate from the support;

one or more heating elements positioned to heat at least the substrate and the substrate support, wherein said heating elements include a plurality of radiant heating lamps which are positioned above the substrate support, and said handler is configured to move above the substrate support and below the lamps, said control system during said preheat period is configured to cause the lamps to heat the upper side of said substrate during said preheat period while said substrate support heats a lower side of the substrate;

a control system configured to cause the handler to hold the substrate above the substrate support for a preheat period before placing the substrate on the support, while maintaining a support temperature of greater than about 900° C. during the time the substrate is being moved on or off the support; and gas tubes connected to provide purging gas to a chamber enclosing the substrate support, and said control system being configured to reduce the flow of purging gas into the chamber during the preheat period.

10. The apparatus of claim 1, wherein the robot handler comprises an end effector that introduces the substrate into a process chamber.

11. The apparatus of claim 10, wherein the robot handler further comprises a robot arm, the end effector located at the end of the robotic arm.

12. The apparatus of claim 10, wherein the end effector is a Bernoulli wand or paddle with a fork-like configuration.

* * * * *